(12) United States Patent
Hutchinson et al.

(10) Patent No.: US 11,386,021 B2
(45) Date of Patent: Jul. 12, 2022

(54) APPARATUS AND METHOD FOR PACKING A BIT STREAM

(71) Applicant: Avago Technologies International Sales Pte. Limited, Singapore (SG)

(72) Inventors: James Andrew Hutchinson, Cambridge (GB); Thomas Oscar Miller, Cambridge (GB); Stephen John Barlow, Cambridge (GB); Jack Stuart Haughton, Cambridge (GB)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 55 days.

(21) Appl. No.: 16/625,400

(22) PCT Filed: Jun. 21, 2018

(86) PCT No.: PCT/GB2018/051737
§ 371 (c)(1),
(2) Date: Dec. 20, 2019

(87) PCT Pub. No.: WO2018/234815
PCT Pub. Date: Dec. 27, 2018

(65) Prior Publication Data
US 2021/0149827 A1    May 20, 2021

(30) Foreign Application Priority Data
Jun. 22, 2017 (GB) .................................. 1710018

(51) Int. Cl.
*G06F 13/16* (2006.01)
*H04N 19/423* (2014.01)
(Continued)

(52) U.S. Cl.
CPC ...... *G06F 13/1668* (2013.01); *H03M 7/4037* (2013.01); *H03M 7/48* (2013.01); *H04N 19/423* (2014.11)

(58) Field of Classification Search
CPC .......................... G06F 13/1668; H04N 19/423
See application file for complete search history.

(56) References Cited

U.S. PATENT DOCUMENTS

| 5,598,388 A | 1/1997 | Van Maren et al. |
| 6,240,379 B1 * | 5/2001 | Yin ........................ G10L 19/002 704/200.1 |

(Continued)

FOREIGN PATENT DOCUMENTS

GB    2530311 A    3/2016

OTHER PUBLICATIONS

International Search Report and Written Opinion for corresponding PCT Appl No. PCT/GB2018/051737, dated Aug. 22, 2018.
(Continued)

*Primary Examiner* — Henry Tsai
*Assistant Examiner* — Aurangzeb Hassan
(74) *Attorney, Agent, or Firm* — BakerHostetler (57) ABSTRACT

A data packer forma bit stream for forwarding values to memory. The bit stream includes the values and respective prefixes for identifying the values and the data packer is configured to insert the prefixes at predetermined boundaries in the bit stream, such that a prefix for identifying one value is inserted between bits that define a value identified by a preceding prefix. A data unpacker unpacks a bit stream that comprises values and respective prefixes for identifying those values that are located at predetermined boundaries in the bit stream, such that a prefix for identifying one value is inserted between bits that define a value identified by a preceding prefix. The data unpacker identifies a prefix at a
(Continued)

predetermined boundary in the bit stream and determine, in dependence on that prefix and the predetermined boundaries, a location of the next prefix in the bit stream.

17 Claims, 6 Drawing Sheets

(51) Int. Cl.
*H03M 7/40* (2006.01)
*H03M 7/48* (2006.01)

(56) References Cited

U.S. PATENT DOCUMENTS

| | | | | |
|---|---|---|---|---|
| 6,308,257 | B1* | 10/2001 | Theogarajan | G06F 9/30145 |
| | | | | 711/209 |
| 9,299,166 | B2* | 3/2016 | Lachine | H04N 19/593 |
| 9,774,875 | B2* | 9/2017 | MacInnis | H04N 19/61 |
| 2005/0207659 | A1 | 9/2005 | Kodama | |
| 2005/0254497 | A1 | 11/2005 | Miyagawa et al. | |
| 2007/0242894 | A1* | 10/2007 | Kautzer | H04N 19/593 |
| | | | | 382/243 |
| 2009/0044072 | A1* | 2/2009 | Oh | H03M 13/6356 |
| | | | | 714/758 |
| 2014/0344642 | A1* | 11/2014 | Kikugawa | H03M 5/14 |
| | | | | 714/759 |
| 2015/0078477 | A1* | 3/2015 | Hong | H04L 1/0071 |
| | | | | 375/295 |
| 2016/0198171 | A1* | 7/2016 | Wu | H04N 19/44 |
| | | | | 375/240.16 |

OTHER PUBLICATIONS

Search Report for corresponding GB Appl No. 1710018.1, dated Dec. 5, 2018.

* cited by examiner

APPARATUS AND METHOD FOR PACKING A BIT STREAM

CROSS-REFERENCE TO RELATED APPLICATIONS

This application is a national stage of and claims priority under 35 U.S.C. § 371 to PCT Application No. PCT/GB2018/051737, filed on Jun. 21, 2018, which claims priority to GB Application No. 1710018.1, filed on Jun. 22, 2017. The contents of both of these priority applications are hereby incorporated by reference in their entirety.

This invention relates to an apparatus and method for packing a bit stream and for unpacking a bit stream that has previously been packed.

Image processing is one but by no means the only field in which large amounts of data often have to be temporarily stored for retrieval later in the process. Computers generally read from and write to memory in word sized chunks or larger. System performance can be enhanced by aligning data with multiples of the memory word size. This may require meaningless padding bits to be inserted into the data to extend the length of individual data structures to multiples of the memory word size. This arrangement does not make optimal use of available memory, particularly for applications where memory may be restricted.

One example of an application in which a large amount of image data has to be stored in memory is the process of stitching together multiple overlapping images to form a larger image. It is possible to stitch together enough images to create a 360° image. The process may be achieved using a multiband blend process. Each level of the process may blend together decimated representations of the original camera images. This process may be performed over multiple levels, with each successive level of the process blending representations that are progressively decimated with respect to the original camera images. The progressively decimated representations can be considered to form a pyramid of images and, once generated, that pyramid is usually stored in memory before being retrieved during the multiband blend process.

According to a first aspect, there is provided a data packer configured to form a bit stream for forwarding a plurality of values to memory. The bit stream includes the plurality of values and respective prefixes for identifying the values. The data packer is configured to insert the prefixes at predetermined boundaries in the bit stream such that a prefix for identifying one value is inserted between bits that define a value identified by another prefix.

Other aspects may include one or more of the following:

The data packer may be configured to insert a prefix at a predetermined boundary that is selected to accommodate, between the prefix and the preceding prefix in the bit stream, only some of the bits that define the value identified by the preceding prefix.

The data packer may be configured to select the boundary for the prefix to be the predetermined boundary that will accommodate the highest number of bits that define the value identified by the preceding prefix without leaving a gap between the last of those bits and the prefix.

The data packer may be configured to select the bit boundary to further accommodate any bits that: (i) define the value that is identified by the prefix before the preceding prefix in the bit stream; and (ii) were not accommodated before the preceding prefix in the bit stream.

The data packer may be configured to, if there are insufficient bits to be accommodated between one prefix and the next predetermined boundary in the bit stream to fill the available bits, insert padding bits into the bit stream to fill those available bits.

The data packer may be configured to form a prefix to include a code that is associated with the prefix's respective value, wherein said code represents a range and the respective value defines an offset within that range.

The data packer may be configured to insert the prefixes at boundaries that are positioned at multiples of a word length employed by the memory.

Different ones of the plurality of values may be defined by different numbers of bits in the bit stream.

The bit stream represents a plurality of symbols and the data packer may be configured to form each prefix such that it identifies a type of symbol that is represented by that prefix.

The type of symbol may include one or more of a run length and a pixel value.

A prefix may identify a number of bits that form its respective value in the bit stream.

According to a second aspect, there is provided a method comprising forming a bit stream for forwarding a plurality of values to memory, said bit stream including the plurality of values and respective prefixes for identifying the values, by inserting the prefixes at predetermined boundaries in the bit stream such that a prefix for identifying one value is inserted between bits that define a value identified by another prefix.

According to a third aspect, there is provided a data unpacker configured to unpack a bit stream that comprises a plurality of values and respective prefixes for identifying those values that are located at predetermined boundaries in the bit stream. A prefix for identifying one value is inserted between bits that define a value identified by another prefix. The data unpacker is configured to identify a prefix at a predetermined boundary in the bit stream and determine, in dependence on that prefix and the predetermined boundaries, a location of the next prefix in the bit stream.

The data unpacker may be configured to determine, in dependence on the prefix, a number of bits that form the prefix's respective value in the bit stream.

The data unpacker may be configured to determine that some of said number of bits will be located between the prefix and the next prefix in the bit stream and others of said number of bits will be located after the next prefix in the bit stream.

The data unpacker may be configured to reconstruct the prefix's respective value by combining said some bits with said others of the number of bits and outputting the combination as the respective value.

According to a fourth aspect, there is provided a method for unpacking a bit stream that comprises a plurality of values and respective prefixes for identifying those values, located at predetermined boundaries in the bit stream, such that a prefix for identifying one value is inserted between bits that define a value identified by another prefix. The method comprises locating a prefix at a predetermined boundary in the bit stream and determining, in dependence on that prefix and the predetermined boundaries, a location of the next prefix in the bit stream.

The present invention will now be described by way of example with reference to the accompanying drawings. In the drawings.

Figure 1:
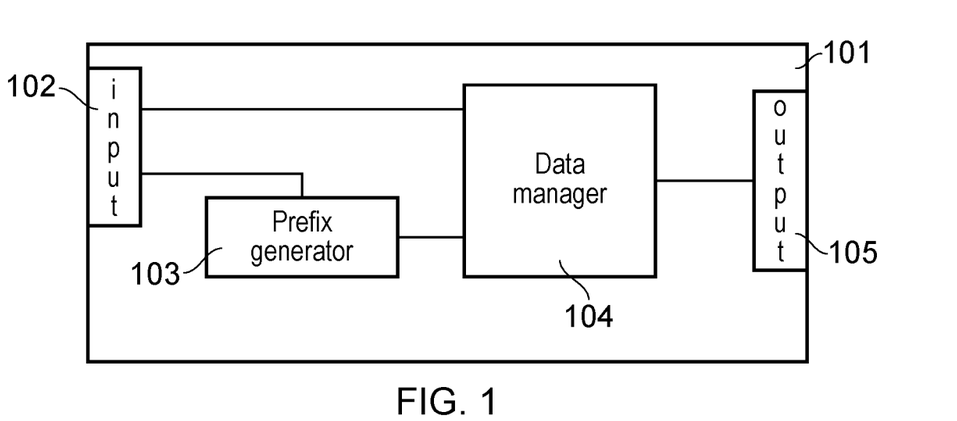
FIG. 1 shows an example of a data packer.

An example of a data packer is shown in FIG. 1. The data packer is shown generally at 101. The data packer is configured to form a bit stream for forwarding values to memory. The bit stream includes a plurality of values and respective prefixes, so that each value has a prefix to identify it. In the data packer of FIG. 1, the data packer comprises an input 102 that is configured to receive the plurality of values. The data packer also comprises a prefix generator 103 that is configured to generate the prefixes. The data packer preferably arranges the values and prefixes in such a way that they can be straightforwardly written to memory and subsequently unpacked when read from memory. In FIG. 1, the arrangement of the values and prefixes in the bit stream is handled by data manager 104. In practice, the data manager may be implemented by some form of shift register. The data packer is configured to insert the prefixes at predetermined boundaries in the bit stream. This is preferably achieved without introducing unnecessary gaps in the bit stream. Consequently, a prefix for identifying one value can be inserted between bits that define a value identified by another prefix. The data packer may then output the resulting bit stream via output 105.

Figure 2:
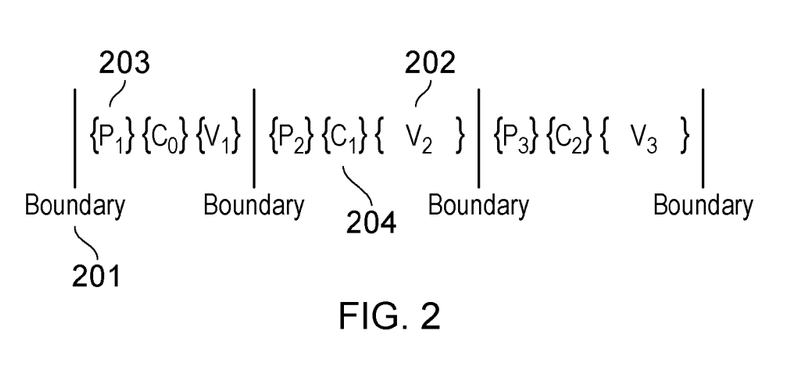
FIG. 2 shows an example of a packed bit stream.

FIG. 2 shows an example of a bit stream in which a prefix for identifying one value is inserted between the bits that define a value identified by another prefix. The bit stream comprises three values (202), each of which is defined by a plurality of bits. Each value is accompanied by a respective prefix (203). The prefixes are arranged at predetermined boundaries (201). Each prefix is followed by some bits that define its respective value, e.g. $P_1$ and $V_1$, $P_2$ and $V_2$ and $P_3$ and $V_3$. In each case, however, there is insufficient space for all the bits that define the prefix's respective value before the next predetermined boundary. This results in carry bits (204), which still have to be accommodated. In the example of FIG. 2, the carry bits are accommodated immediately after the next prefix in the bit stream. So, in FIG. 2, prefix $P_1$ is immediately followed by carry bits $C_0$ that belong to the preceding prefix in the bit stream, namely $P_0$ (which is not shown). This same pattern is repeated throughout the bit stream, with the result that many prefixes are inserted between the bits that define the value that is identified by the preceding prefix in the bit stream (e.g. $P_2$ is inserted between $V_1$ and $C_1$, which together are the bits that define the value identified by $P_1$).

The data manager 104 may be configured to shift the prefixes into the bit stream at boundaries that are selected in dependence on how many bits the data manager wants to accommodate between one prefix and the next. For example, the data manager preferably always tries to accommodate any bits that belong to the prefix before the preceding prefix in the bit stream, but which were not able to be accommodated before that preceding prefix. This is illustrated by the example in FIG. 2: the boundary for $P_3$ is selected to be able to accommodate $C_1$, the carry bits that were not able to be accommodated between $P_1$ and $P_2$. The data manager may also try to accommodate the highest number of bits that define the value identified by the preceding prefix without leaving a gap between the last of those bits and the prefix. So, for example, in FIG. 2 the data manager will have selected the boundary for $P_3$ to fit the largest number of bits possible in $V_2$ and to minimise the number of carry bits $C_2$ but without leaving a gap between the end of $V_2$ and the start of $P_3$ that would otherwise have to be filled with meaningless padding bits. In some scenarios, however, there may not be enough value bits to fill all the available bits between one boundary and the next. In this scenario, the data manager may insert padding bits into the bit stream to fill any empty spaces.

The boundaries may be evenly or unevenly spaced. In one preferred example, the boundaries are spaced at multiples of a word length employed by the memory. For example, if the memory stores 16 bit words, the bit boundaries may be at positioned at bits 0, 15, 31, 47 etc of the bit stream. The boundaries represent potential locations for prefixes. The values belonging to each prefix will usually vary in length so although the boundaries may be evenly spaced, the prefixes will often not be. For example, there will usually not be a prefix at every boundary.

The prefix generator preferably generates the prefixes so that they provide information that is helpful for unpacking the bit stream. The bit stream typically represents a series of symbols. For example, the bit stream may represent a combination of quad symbols (which represent image data) and run-length symbols. Suitably the prefixes are formed to identify the types of symbol that they represent. In some of the examples below, the symbols are quad symbols while in others they are run-length symbols. A quad symbol may be represented in the bit stream by a combination of a prefix and an associated value. A run-length symbol may be represented by a prefix only (this is described in more detail below). The values will tend to have different numbers of bits, so the prefixes suitably identify how many bits in the bit stream belong to a particular value. This information is useful to the data unpacker, which can use it to work out the distance between one prefix and the next in the packed bit stream.

Figure 3:
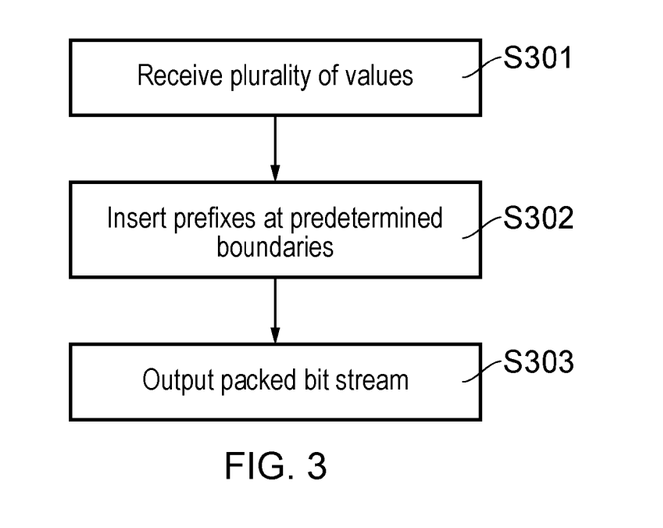
FIG. 3 shows an example of a method for packing data

An overview of a method for packing a plurality of values and associated prefixes into a bit stream is shown in FIG. 3. The method commences with receiving a plurality of values that are to form the basis for the bit stream (step S301). The method then inserts the required prefixes at predetermined boundaries in the bit stream (step S302), before outputting the packed bit stream (step S303). In many implementations, it is expected that the packed bit stream will be output for writing to a memory, although the bit stream could be formed for any purpose.

Packing the bit stream in the way described above has a number of advantages. First it arranges the data in a format that can be straightforwardly written to memory without wasting memory bandwidth by including many padding bits. Second it means that the unpacking operation can be parallelised since the data unpacker knows where in the bit stream to find the prefixes that will tell it which bits in the bit stream belong to which value.

Figure 4:
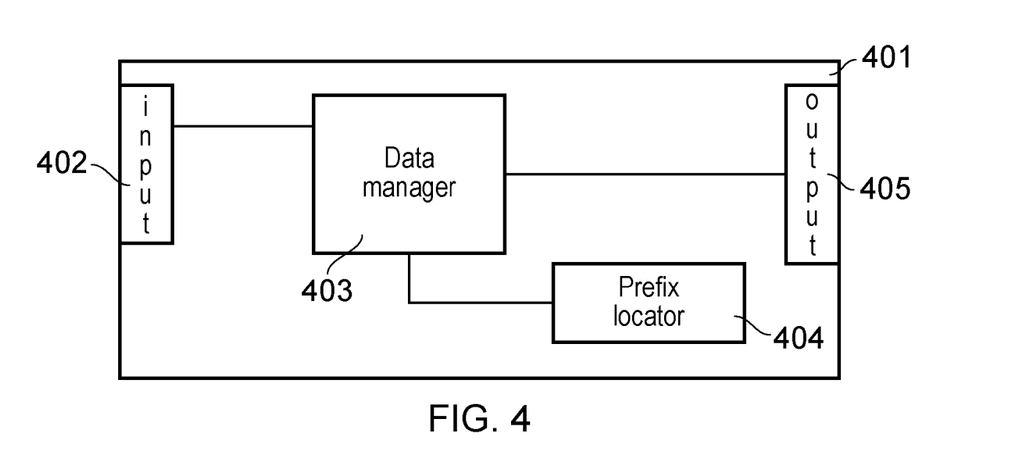
FIG. 4 shows an example of a data unpacker.

An example of a data unpacker is shown in FIG. 4. The data unpacker is shown generally at 401. It is configured to unpack a bit stream that comprises a plurality of values and respective prefixes for identifying those values. As described above, the prefixes are located at predetermined boundaries in the bit stream such that a prefix for identifying one value may be inserted between bits that define a value identified by another prefix. The data unpacker comprises an input 402 that is configured to receive the packed data stream. In some implementations, the packed data stream may be provided to the data unpacker from a memory. The data unpacker also comprises a data manager (403) that is configured to identify a prefix at a predetermined boundary in the bit stream. In some implementations, the data manager may be implemented by a buffer that is configured to receive the packed bit stream. In such an implementation, the buffer may identify a prefix as the first group of a predetermined number of bits that the buffer receives. The data unpacker includes a prefix locator (404) that is configured to determine the location of the next prefix in the bit stream. The prefix locator uses the already identified prefix and its knowledge of the predetermined boundaries to determine the location of the next prefix. The data unpacker may output the prefixes and values resulting from the unpacking via output 405.

The data unpacker may be configured to use information in an identified prefix to determine the number of bits that will occur in the bit stream between one prefix and the next. For example, the prefix locator (404) may use information in the prefix about the number of bits that its respective value contains to work out how many of those bits will be accommodated before the next prefix and how many of those bits will form carry bits that are accommodated between the next prefix and the one after that. In some implementations, the data manager (403) may be configured to recombine bits that are separated in the packed bit stream to output complete values.

Figure 5:
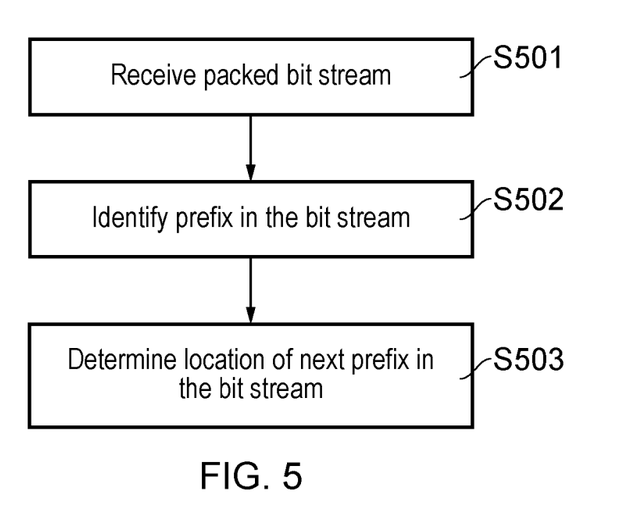
FIG. 5 shows an example of a method for unpacking data.

An overview of a method for unpacking a bit stream is shown in FIG. 5. The method commences with receiving a packed bit stream (step S501). It then identifies a prefix at a predetermined boundary in the bit stream (step S502). Finally, it determines the location of the next prefix in the bit stream in dependence on the identified prefix and the predetermined boundaries (step S503).

A practical example of a how the data packing and unpacking concepts described above might be employed in a real-world application will now be described with reference to an image processing application. This is for the purposes of example only. It should be understood that the concepts described herein may be advantageously employed in any application in which a stream of data bits is being packed, including any application in which a stream of data bits has to be written to and read from memory.

The image processing application may be implemented by a system that is configured to process multiple images at a time. One possible use of such a system is to produce spherical video content. For example, the multiple images may be photographs taken by six individual cameras. Each camera may represent one face of a cube. The system's role is to stitch together groups of six images to output a video stream of spherical images. This is done by first transforming the camera images. A pyramid is then generated for each transformed image through a series of filtering and sampling operations. The resulting pyramids are then written to memory, before being retrieved from memory and blended together using multiband blending to create the final stitched output.

The original images that are received by the system will be formed from a plurality of pixels. Each pixel is likely to be represented by its own set of pixel values. It is these values that define how the pixel appears to the viewer, e.g. when displayed on a screen. The pixel values are determined by the colour model. Examples of suitable colour models include RGB and YUV. The specific examples described below make use of the YUV colour model, in which Y is the luma component (brightness) and U and V are the chroma components (colour). Each pixel value can be considered to represent a particular "channel". Another "channel" may be provided by the alpha value, which often accompanies the pixel values. The alpha values define how the frames for different images should be blended together during the pyramid sum. The chroma channels U and V are commonly downsampled by a factor of two with respect to the luma channel. This is known as YUV420. The same downsampling is applied to the alpha channel. Thus, the apparatus receives image data in the form of "quads", comprising 4 luma pixels, 2 chroma pixels and an alpha value.

Compression of the Pyramid: An Overview

Figure 6:
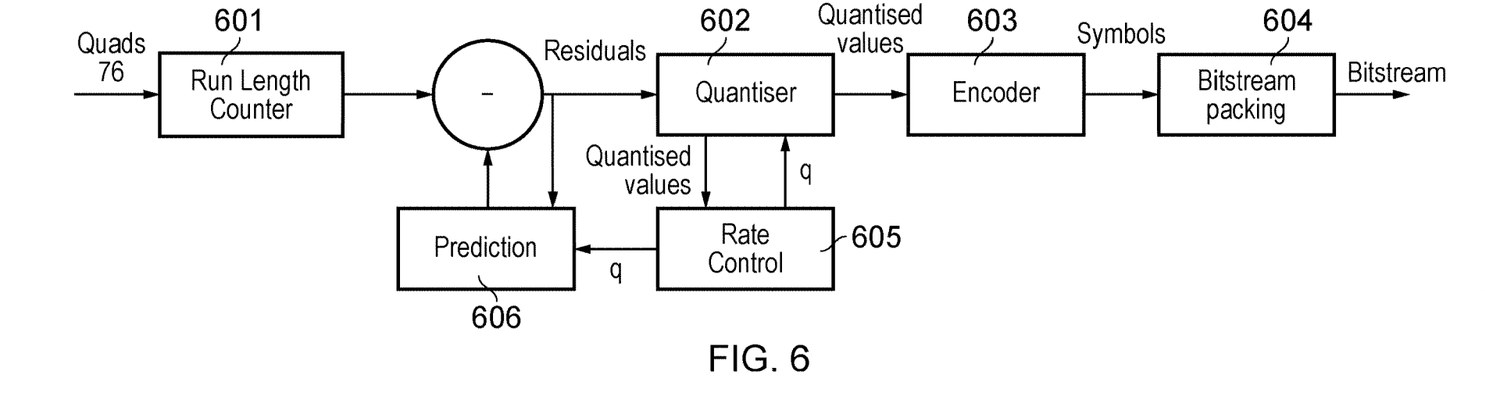
FIG. 6 shows an example of a compression pipeline incorporating a data packer.

An example of a compression pipeline is shown in FIG. 6. The pipeline's function is to receive image data, to compress that data (where appropriate) and pack it into a bit stream that can be output for writing to memory. The pipeline comprises a run length counter 601, a quantiser 602, an encoder 603, a packing block 604, a rate controller 605 and a prediction block 606. The image data (represented by the incoming quads on the left-hand side of the pipeline) belongs to a series of frames that together form a pyramid of progressively decimated images. This pyramid of images may be stored in memory before they are retrieved and stitched together as part of a multi-band blend process.

The compression pipeline is configured to compress data before it is written to SDRAM (synchronous dynamic random access memory). This data includes the pyramid of progressively decimated representations. In this example, the pyramid is a Laplacian pyramid. The Laplacian pyramid represents the image as a series of frames. Those frames contain different frequency components of the image. The frames are bandpass images, each frame represents the original image within a limited bandwidth. The Laplacian pyramid has multiple levels and each level has a frame corresponding to a different bandwidth. The frequencies getting progressively higher in each successive step up the pyramid. One efficient process for generating the Laplacian pyramid involves repeatedly downsampling, upsampling and subtracting the images. Starting with the original image, each frame in the Laplacian pyramid is formed by reducing an image from the preceding level of the pyramid, expanding that reduced image and subtracting the expanded image from the image of the preceding level. The reduced image then becomes the "image associated with the preceding level" for the next iteration of the process.

The Laplacian pyramid is just one example of a pyramid of progressively decimated representations that can be used to blend multiple images together. Other pyramids may also be used, such as a Gaussian pyramid. An advantage of the Laplacian pyramid, however, is that the data tends to be heavily biased towards zero and so good compression can be achieved without prediction (as explained below).

Each frame in a Laplacian pyramid is formed from a plurality of values. These values are differences, which is why they tend to be heavily skewed towards zero. To compress the pyramid, the encoder 603 can be configured to assign each value a respective code. The codes may be variable in length, so that pyramid values are encoded with different numbers of bits. Suitably the number of bits that is assigned to encoding a value is dependent on its magnitude. More bits are suitably assigned to higher (and thus less common) values. In one example, the encoder may be configured to encode the pyramid values using bucket coding, which is described in more detail below.

Figure 7:
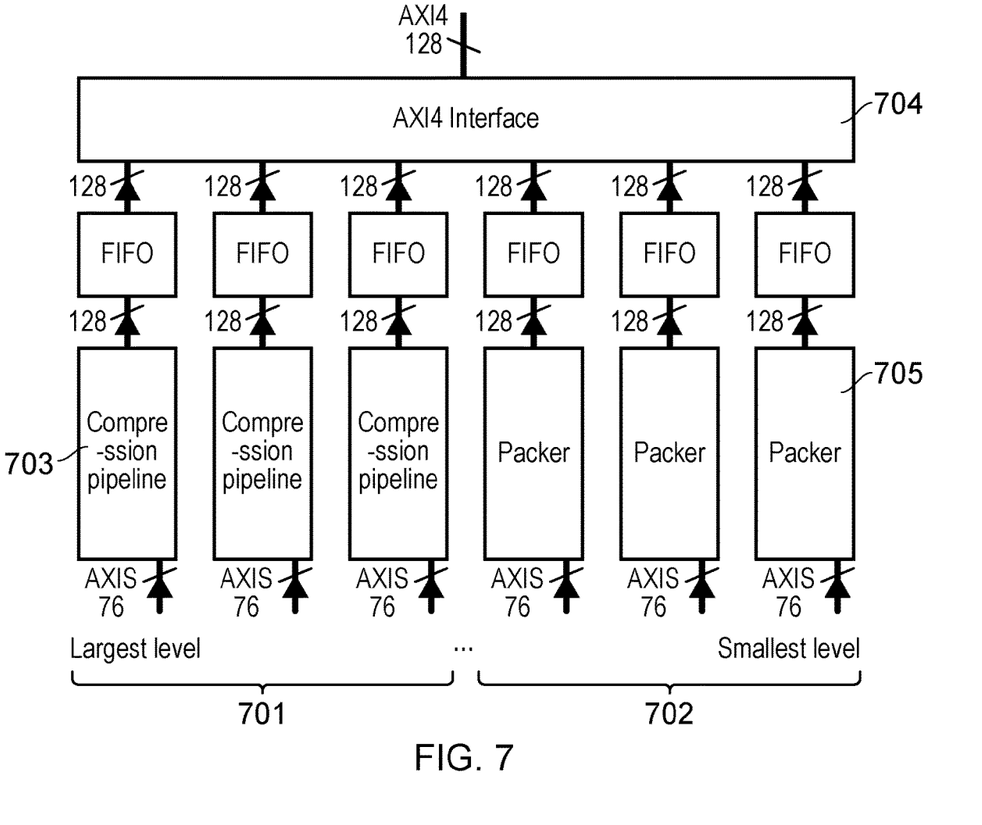
FIG. 7 shows an example of a compression interface.

The compression pipeline may be configured to compress the Laplacian pyramid by compressing some, but not all, of the frames in the pyramid. The compression pipeline may decide whether to compress a frame in dependence on which level of the Laplacian pyramid the frame corresponds to. For example, the smallest three levels of the Laplacian pyramid may be stored uncompressed. These frames are commonly only 2% of the size of the largest level of the pyramid, so there is little benefit in compressing them. This is represented in FIG. 7, which shows an example of a compression interface in which the highest levels of the pyramid (701) pass through the entire compression pipeline (703) before being transferred to the AXI4 interface (704) for being written to memory while the three lowest levels of the pyramid (702) are packed differently, skipping the quantiser (602) and encoder (603) of the early compression pipeline.

Run Length Counting

The compression pipeline may be preceded by a transform block. The transform block may apply a transform to the original camera images before the pyramid is formed. Commonly this transform results in arbitrarily-shaped images, with the result that some areas of the transformed images will have blocks of empty quads. For efficiency, the transform block may be configured to skip blocks of empty quads when forming the pyramids. The run length counter 601 may be configured to support this process by run-length encoding the empty quads.

Quantisation

Quantiser 602 may precede encoder 603. It is configured to quantise values in the Laplacian pyramid. Since these values are differences formed via a subtraction operation, they can also be termed "residuals". The decision about whether or not to set a particular value to zero is preferably taken in dependence on the magnitude of that value. In one example, the quantisation scheme sets all residuals within a predetermined range around zero to zero. This creates a so-called "dead zone".

Quantisation reduces the amount of data that needs to be stored at the expense of losing some information. However, many of the residuals around zero are the result of noise, meaning that information loss should be minimal. Setting residuals in the dead zone to zero not only reduces the number bits that are required to encode those residuals, it also frees up shorter codes for encoding larger residuals with fewer bits than would otherwise be the case.

For a residual, r, and a quantising parameter q, the quantised residual, v, is given by:

$$v = \begin{vmatrix} 0 & |r| \leq q \\ r - \text{sgn}(r)q & |r| > q \end{vmatrix}$$

For a quantised residual, v, and a quantising parameter q, the dequantized residual, r, is given by:

$$r = v + \text{sgn}(v)q$$

Quantisation of the residuals can also advantageously be used to control the rate of the bit stream. This can be achieved by the quantiser altering the size of the dead zone. The size of the dead-zone increases as the "quantising parameter" q increases in size. This has the effect of sacrificing small changes whilst preserving large changes. The quantising parameter may adapt throughout a frame. The size of the quantising parameter is suitably chosen to achieve a target number of bits for each pixel. This enables the compression block to adapt to the memory constraints of the system.

Rate Control

Rate control is used to achieve a target number of bits per quad. The rate controller 605 is configured to control how the quantiser varies the size of the dead zone by providing the quantiser with the quantising parameter. The aim of the rate controller is suitably to achieve a target bit rate. The rate controller may be configured to adjust the quantising parameter on a per quad basis in dependence on the target.

The rate controller 605 may choose the quantising parameter based on the current bitrate and the target bitrate. The term "current" may refer to the pyramid that is currently being processed by the compression pipeline or to an individual frame. The quantising parameter may be proportional to the difference between the number of bits spent so far in the current frame, A, and a target number of bits to be spent at this point in the current frame, T:

$$q = \left\lfloor \frac{A - T + 4095}{8192} \right\rfloor$$

(A–T) may be stored in the rate controller as a 32-bit signed number. It is suitably clamped within the range $[-2^{31}, 2^{31}-1]$.

The target is calculated by accumulating a target number of bits per quad for the quads processed so far in the current frame. These target numbers may be supplied to the rate controller by a register. For example, the rate controller may be configured to calculate and accumulate the number of bits which will be required to encode a quad (including padding).

The choice of quantising parameter may be delayed by one symbol to ease timing, particularly for hardware implementations. In this scenario, the first two symbols will use a quantiser of zero. The quantiser for the third symbol will be based on the bitrate error from the first symbol and so on.

Alpha Prediction

The compression pipeline in FIG. 6 includes a predictor 606. The predictor is configured to perform a prediction on some, but not all, of the channels represented by the quads. Suitably the predictor chooses which channels to predict in dependence on the type of data that they represent. The Y, U and V channels are preferably not predicted. As explained above, the values for these channels are taken from a Laplacian pyramid and are therefore already heavily skewed towards zero. There is little to be gained from prediction in this case, and not performing prediction reduces compression complexity. However, the alpha channel, which defines how frames from different images should be blended together, is not formed from residual values and does benefit from prediction.

The alpha channel may be predicted by predictor 606. The alpha channel is expected to be smooth. It can be predicted using a gradient from two contexts. $\alpha_0$ can be predicted from $\alpha_{-2}$ and $\alpha_{-3}$. This is shown in 1 below. Here $\alpha_{-1}$ is the previous value; $\alpha_{-2}$ is the value before that, and so on.

TABLE 1

| Alpha prediction context | | | |
| --- | --- | --- | --- |
| $\alpha_{-3}$ | $\alpha_{-2}$ | $\alpha_{-1}$ | $\alpha_0$ |

The predicted value for $\alpha_0$ can be derived as:

$$\max(0, \min(1023, 3\alpha_{-2} - 2\alpha_{-3}))$$

The gap of one before a value is used for prediction is helpful to ease timing for hardware implementations, especially since the prediction uses reconstructed values after quantisation.

Where insufficient context is available for the prediction to be calculated, the predictor is suitably configured to set the prediction to zero.

Given a predicted alpha, p, and an alpha value, α, the residual, r, can be given by the following:

$$r = \begin{vmatrix} p - \alpha & |p - \alpha| \le \min(p, 1023 - p) \\ \frac{\alpha}{2} - p \ \&512 & \alpha = 0 (\bmod 2) \land |p - \alpha| > \min(p, 1023 - p) \\ -\frac{\alpha + 1}{2} - p \ \&512 & \text{otherwise} \end{vmatrix}$$

Given a predicted alpha, p, and a residual, r, the alpha value, $\alpha$, can be given by the following:

$$\alpha = \begin{vmatrix} p - r & |r| \le \min(p, 1023 - p) \\ 2r & ((r \ge 0 \land p < 512) \lor (r < 0 \land p \ge 512)) \land |r| > \min(p, 1023 - p) \\ -2r - 1 & \text{otherwise} \end{vmatrix}$$

Bucket Coding

Once the quantised residuals have been computed, they are output to the encoder 603 and encoded. This is preferably done using a variable length code First, the input domain [−1024, 1023] is mapped to an all positive domain [0-2047]:

$$u = \begin{vmatrix} -2v - 1 & v < 0 \\ 2v & v \ge 0 \end{vmatrix}$$

This domain is then divided into four buckets, each of which is given a power-of-two size, with the sum of the sizes constrained to be greater than or equal to 2048. For instance, with bucket sizes $2^0$, $2^0$, $2^1$ and $2^{11}$, the buckets would contain the following ranges:

TABLE 2

Bucket ranges

| Bucket | u range |
| --- | --- |
| 0 | 0 |
| 1 | 1 |
| 2 | 2-3 |
| 3 | 4-2047 |

Residuals may be encoded as a two-bit bucket ID and an n-bit offset within the indicated bucket, where n is log of the bucket size. For example, using the above bucket configuration, the value 2 would be encoded as 10 0 (bucket 2, offset 0), whilst value 7 would be encoded as 11 0000000011 (bucket 3, offset 3).

This scheme works well as low ranges, common in Laplacians, can be encoded in few bits by making the low buckets small leaving the larger high buckets to take uncommon high values.

The encoder may be configured to implement bucket coding by performing the following steps:
1. Convert the signed quantised value (v) to an unsigned one (u).
2. Find the bucket which contains the unsigned value.
3. Subtract the lower limit of the bucket from the unsigned value,
4. Output the coded value and bucket.

These steps may be reversed by a corresponding decoder shown at 601 in the corresponding decompression pipeline shown in FIG. 6
1. Add the lower limit of the bucket to the coded value
2. Convert the value from unsigned to signed.

3. Output the quantised residual.

Suitable choices of buckets for the different channels are shown in 3.

TABLE 3

Bucket configuration

| Level | Channel | Bucket 0 | Bucket 1 | Bucket 2 | Bucket 3 |
| --- | --- | --- | --- | --- | --- |
| 5 (Largest) | Y | 3 | 4 | 6 | 11 |
| 5 (Largest) | U | 2 | 3 | 5 | 11 |
| 5 (Largest) | V | 2 | 3 | 5 | 11 |
| 5 (Largest) | $\alpha$ | 0 | 2 | 4 | 10 |
| 4 | Y | 2 | 4 | 6 | 11 |
| 4 | U | 2 | 3 | 5 | 11 |
| 4 | V | 1 | 2 | 4 | 11 |
| 4 | $\alpha$ | 0 | 3 | 5 | 10 |
| 3 | Y | 3 | 5 | 7 | 11 |
| 3 | U | 2 | 3 | 5 | 11 |
| 3 | V | 1 | 2 | 5 | 11 |
| 3 | $\alpha$ | 0 | 4 | 6 | 10 |

Bit Stream Packing

The bit stream packer 604 is configured to receive different types of data. For example, the bit stream packer is configured to receive run-length encoded data from the counter 601 that represents empty quads in the incoming image data. The bit stream packer is also configured to receive uncompressed quad data from the lowest levels of the pyramid. Finally, the bit stream packer is configured to receive quad date that has been encoded by encoder 603. As described above, that data will typically take the form of a bucket code, which represents a range for the quantised residual, and a coded value, which represents an offset within that range.

The bit stream packer 604 is configured to form a bit stream that is formed of two logically distinct parts:
1. Prefixes: the prefixes are fixed length. They are stored at fixed offsets in the bit stream. They include code length information, which defines the number of bits that form the prefix's respective value.
2. Values: the values are variable length. They are stored between the prefixes in the bit stream, They are formed from a plurality of bits. The values define the code quantised values (i.e. the "coded value" output by encoder 603 in its step 4 outlined above) for higher levels of the pyramid and the straightforward pixel value for lower levels of the pyramid.

The format of each prefix depends on the type of symbol that the prefix is identifying. In this example, the two symbol types are run-length or quad. For example, the prefix for a run-length symbol may have the following format:

{1'b0,run_length[13:0]}

Where the code 1'b0 identifies this as being a run-length symbol. This prefix can be used to identify any run-length encoded empty quads that are represented by the bit stream.

For a quad symbol, the prefix may have the following format:

{1'b1, Y0B[1:0], Y1B[1:0], Y2B[1:0], Y3B[1:0], UB[1:0], VB[1:0], aB[1:0]}

Where the codes "Y0", "Y1", "U" etc represent the channel and the code "B" represents the selected bucket for the channel in question.

In one example, prefixes are 15 bits long. They are aligned to 16 bit boundaries of the bit stream, allowing fast location of the next prefix during unpacking. Values are between 0 and 76 bits long for each symbol. The value length is zero for a run-length symbol. The length for a quad symbol depends on the chosen bucket. The values for each channel may be packed in the following order (from MSB to LSB): Y0, Y1, Y2, Y3, U, V, a.

To retain the 16-bit alignment property of the prefixes without requiring unnecessary padding, the bit stream packer 604 may be configured to split values across prefixes. This produces a bit stream having the following format:

{prefix_0, value_0(MSBs), prefix_1, value_0(LSBs), value_1(MSBs), prefix_2, value_1(LSBs), . . . prefix_n, value{n−1}(LSBs), value_n(MSBs), 15'b0, value_n(LSBs)}

Where the prefix "15'b0" is inserted as the final prefix of the bit stream. This is a run-length symbol of length 0, and it is used to mark the end of the stream.

For an implementation in which the prefixes are aligned with 16 bit boundaries of the bit stream, the bit stream packer 604 may determine the spacing between one prefix and the next as follows:

$$d_n = \text{floor}\left(\frac{15 + \max(l_n, 15) + r_{n-1}}{16}\right)$$

where $l_n$ is the length of the current value and $r_{n-1}$ is the remaining length of the previous value. $d_n$ is given in 16 bit words, and has a range of [1,6].

The remaining length $r_n$ is given by:

$r_n = \max(0, 15 + l_n + r_{n-1} - 16d_n)$

The range of $r_n$ is [0, 15]. $r_0$ is defined as zero.

The bit stream packer 604 is configured to insert padding when $16d_n > 15 + l_n + r_{n-1}$. The bits in the padding can take any value, since they will not be read by the decoder.

The equations above can be straightforwardly adapted to implementations in which the length of the prefix or spacing between boundaries is different by changing the values "15" and "16" to whatever is appropriate for that implementation.

The bit stream packer 604 is suitably configured to keep to a maximum length between the start of a prefix and the end of the LSBs of the corresponding value. This then sets a number of bits that must be read to guarantee that an entire symbol is available to be decoded. A suitable maximum length could be 121 bits.

The bit stream packer 604 may be configured to pack the bit stream in two stages. The packer may be configured to receive 7 coded values and corresponding buckets or a run length in each iteration. In the first stage, these are packed into a prefix and value. In the second stage, the prefix and value are packed into the bit stream.

The first stage may be implemented by a pipeline configured to perform the following steps (where the bit stream packer has received 7 coded values and corresponding buckets):

1. Shift in the code for a, if this is a quad symbol.
2. Shift in the code for V, if this is a quad symbol.
3. Shift in the code for U, if this is a quad symbol.
4. Shift in the code for Y3, if this is a quad symbol.
5. Shift in the code for Y2, if this is a quad symbol.
6. Shift in the code for Y1, if this is a quad symbol.
7. Shift in the code for Y0, if this is a quad symbol.
8. Output the prefix, value and length of the value.

The second stage in the bit stream packer 604 maintains a 256-bit buffer in which the outgoing bit stream is created. In each cycle, the bit stream packer:

1. Reads the prefix, value and length from the previous stage.
2. Shifts the new prefix, carry bits and value into the buffer.
3. Stores the carry bits for the next stage.
4. Outputs a 128-bit word if there are 128 valid bits in the buffer.
5. To enable the unpacker to detect the end of the stream, writes prefix 15'b0 back into the block.

The smallest levels of the pyramid may be stored in an uncompressed format. In this format, the bit stream packer 604 is configured to pack elide and present bits, 76 bits of data for each quad, and a 1 bit flag indicating the end of the bit stream. The data for each quad may be padded to 80 bits to simplify the process of packing the data into a 128 bit buffer. Each quad has the format:

{2'b0, elide, end, Y0[10:0], Y1[10:0], Y2[10:0], Y3[10:0], U[10:0], V[10:0], a[9:0]}

Quads that are elided or non-present should have their quad alpha value set to 0.

The bit stream packer 604 is configured to then pack the formatted quads into a bit stream as follows:

{ . . . , quad_2[76:0], quad_1[76:0], quad_0[76:0]}

Bit Stream Unpacking (Decoder)

Figure 8:
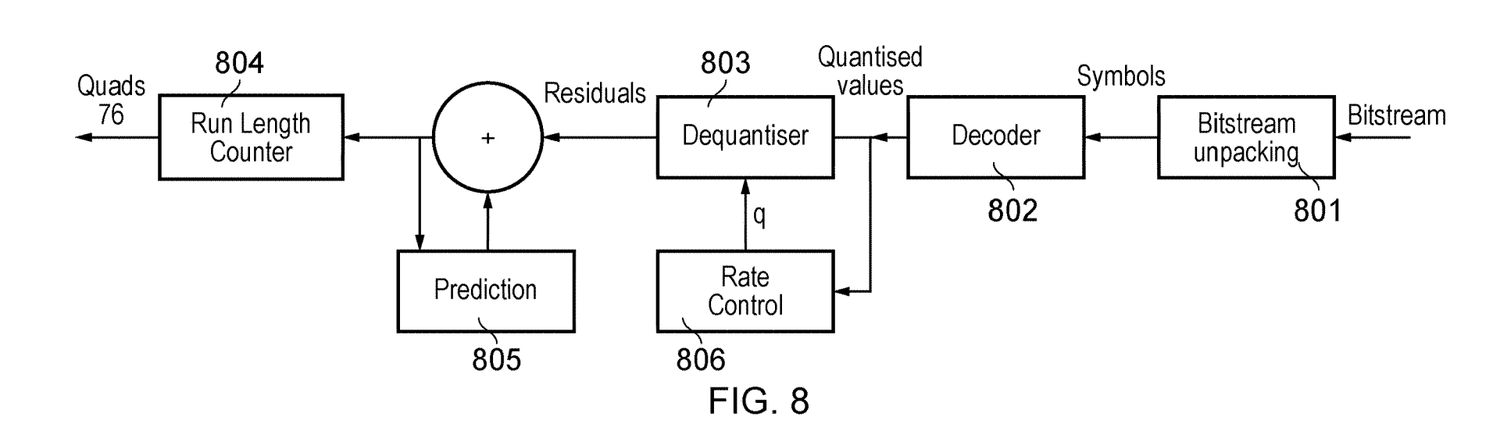
FIG. 8 shows an example of a decompression pipeline incorporating a data unpacker.

An example of a decompression pipeline is shown in FIG. 8. The compression pipeline comprises a bit stream unpacker 801, a decoder 802, a dequantiser 803, a run length counter 804, a predictor 805 and a rate controller 806. In general, the decompression pipeline is configured to reverse the compression processes performed by the compression pipeline shown in FIG. 6. The decompression pipeline is thus configured to unpack an incoming bit stream from memory into symbols (i.e the quads that are output on the left-hand side of FIG. 8).

Figure 9:
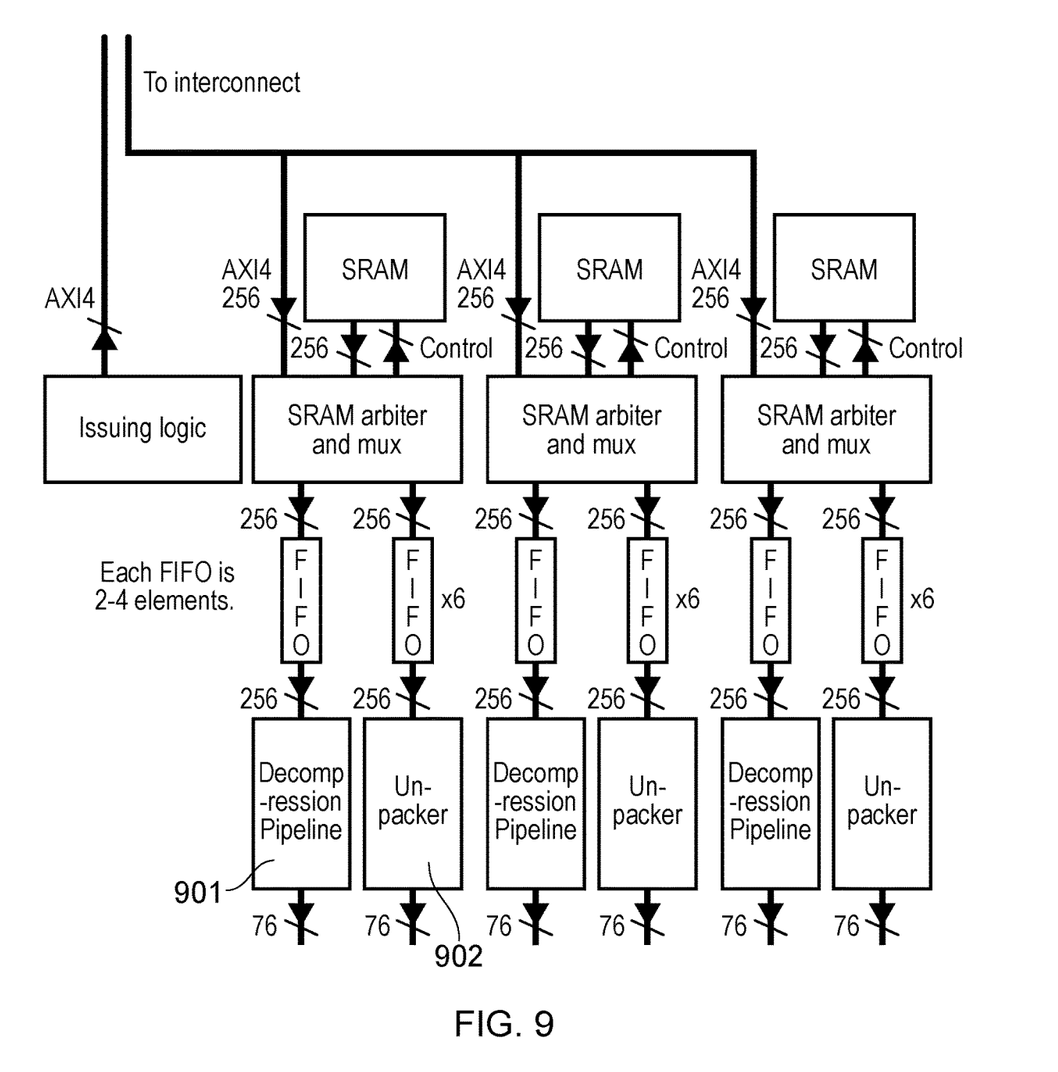
FIG. 9 shows an example of a decompression interface.

Not all of the data read from memory needs to be processed by the whole of the decompression pipeline. For example, lower levels of the pyramid, which were not encoded or quantised on being written to memory, will have no need to have those processes reversed by the decompression pipeline. This is represented in FIG. 9, which shows an example of a decompression interface in which the highest levels of the pyramid (901) pass through the entire decompression pipeline while the three lowest levels of the pyramid (902) need only pass through the bit stream unpacker (902, 801).

The first stage of the unpacking module maintains a 256-bit buffer of the incoming bit stream. In each cycle this module, 1. Outputs the top 121 bits and the carry length.
2. Calculates the length of the value from the prefix.
3. Calculates the position of the next prefix and the carry length.
4. Shifts the buffer up to the next prefix. Loads new data from the incoming bit stream, if there is now space and the bit stream is not finished.

The second stage of the unpacker is a pipeline which extracts the quantised values from the value stream. This pipeline has the following stages:

1. Reconstruct the value for this symbol or extract the run length.
2. Shift out the code for Y0, if this is a quad symbol.
3. Shift out the code for Y1, if this is a quad symbol.
4. Shift out the code for Y2, if this is a quad symbol.
5. Shift out the code for Y3, if this is a quad symbol.
6. Shift out the code for U, if this is a quad symbol.
7. Shift out the code for V, if this is a quad symbol.
8. Shift out the code for a, if this is a quad symbol.
9. Output the codes and buckets for each channel, or the run length.

The structures shown in the figures herein are intended to correspond to a number of functional blocks in an apparatus.

This is for illustrative purposes only. The figures are not intended to define a strict division between different parts of hardware on a chip or between different programs, procedures or functions in software. In many embodiments, some or all of the procedures described herein are likely to be performed predominantly in hardware. For example, any or all of the functional blocks comprised in the image processing pipelines described above might be implemented on an integrated circuit, including an appropriately configured application specific integrated circuit (ASIC) or a field-programmable gate array (FPGA). In some implementations, some or all of the procedures described herein may be implemented by a processor acting under software control. Any such software is preferably stored on a non-transient computer readable medium, such as a memory (RAM, cache, FLASH, ROM, hard disk etc.) or other storage means (USB stick, FLASH, ROM, CD, disk etc). Any of the functional units described herein might be implemented using processing power that is accessible as part of the cloud.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A data packer configured to form a bit stream for forwarding a plurality of values to a memory, wherein said bit stream includes the plurality of values and respective prefixes for identifying the plurality of values and the data packer is configured to:
    insert the prefixes at predetermined boundaries in the bit stream such that a current prefix for identifying a current value is inserted between first one or more bits and second one or more bits, the first one or more bits and the second one or more bits together defining a preceding value identified by a preceding prefix, the predetermined boundaries being positioned at multiples of a word length employed by the memory; and
    select a boundary for the current prefix to be the predetermined boundary to accommodate the highest number of the first one or more bits of the preceding value identified by the preceding prefix without leaving a gap between the last of the first one or more bits and the current prefix, wherein the boundary is located between the first one or more bits and the current prefix.

2. A data packer as claimed in claim 1, wherein the data packer is configured to insert the current prefix at a predetermined boundary that is selected to accommodate, between the current prefix and the preceding prefix in the bit stream, only some of bits that define the preceding value identified by the preceding prefix, and wherein the bits comprise the first one or more bits and the second one or more bits.

3. A data packer as claimed in claim 1, wherein the data packer is configured to select the predetermined boundary to further accommodate any bits that: (i) define a value that is identified by the prefix before the preceding prefix in the bit stream; and (ii) were not accommodated before the preceding prefix in the bit stream.

4. A data packer as claimed in claim 1, wherein the data packer is configured to, if there are insufficient bits to be accommodated between one prefix and a next predetermined boundary in the bit stream to fill available bits, insert padding bits into the bit stream to fill those available bits.

5. A data packer as claimed in claim 1, wherein the data packer is configured to form a prefix to include a code that is associated with the prefix's respective value, wherein said code represents a range and the respective value defines an offset within that range.

6. A data packer as claimed in claim 1, wherein different ones of the plurality of values are defined by different numbers of bits in the bit stream.

7. A data packer as claimed in claim 1, wherein the bit stream represents a plurality of symbols and the data packer is configured to form each prefix such that each such prefix identifies a type of symbol that is represented by that prefix.

8. A data packer as claimed in claim 7, wherein the type of symbol includes one or more of a run length and a pixel value.

9. A data packer as claimed in claim 1, wherein a prefix identifies a number of bits that form its respective value in the bit stream.

10. A data packer as claimed in claim 1, wherein:
    the second one or more bits of the preceding value are separated from the first one or more bits of the preceding value; and
    the second one or more bits of the preceding value are located after the first one or more bits of the preceding value.

11. A data packer as claimed in claim 1, wherein the second one or more bits of the preceding value are one or more carry bits.

12. A data packer as claimed in claim 1, wherein the current prefix identifies a number of bits that form the current value.

13. A method comprising forming a bit stream for forwarding a plurality of values to a memory, said bit stream including the plurality of values and respective prefixes for identifying the plurality of values, by:
    inserting the prefixes at predetermined boundaries in the bit stream such that a current prefix for identifying one value is inserted between first one or more bits and second one or more bits, the first one or more bits and the second one or more bits together defining a value identified by a preceding prefix, the predetermined boundaries being positioned at multiples of a word length employed by the memory; and
    selecting a boundary for the current prefix to be the predetermined boundary to accommodate the highest number of the first one or more bits associated with the value identified by the preceding prefix without leaving a gap between the last of the first one or more bits and the current prefix, wherein the boundary is located between the first one or more bits and the current prefix.

14. A data unpacker configured to unpack a bit stream that comprises a plurality of values and respective prefixes for identifying values that are located at predetermined boundaries in the bit stream such that a current prefix for identifying one value is inserted between first one or more bits and second one or more bits, the first one or more bits and the second one or more bits together defining a value identified by a preceding prefix, the predetermined boundaries being positioned at multiples of a word length employed by a memory, a boundary for the current prefix being the predetermined boundary to accommodate the highest number of the first one or more bits associated with the value identified by the preceding prefix without leaving a gap between the last of the first one or more bits and the current prefix, the boundary being located between the first one or more bits and the current prefix, the data unpacker being configured to:
- identify a prefix at a predetermined boundary in the bit stream; and
- determine, in dependence on the identified prefix and the predetermined boundaries, a location of a next prefix in the bit stream.

15. A data unpacker as claimed in claim 14, wherein the data unpacker is configured to determine, in dependence on the identified prefix, a number of bits that form the identified prefix's respective value in the bit stream.

16. A data unpacker as claimed in claim 15, wherein the data unpacker is configured to determine some of said number of bits to be located between the identified prefix and the next prefix in the bit stream and others of said number of bits to be located after the next prefix in the bit stream.

17. A data unpacker as claimed in claim 16, wherein the data unpacker is configured to reconstruct the identified prefix's respective value by combining said some of said number of bits with said others of said number of bits and to output the combination as the identified prefix's respective value.

* * * * *